(12) United States Patent
Suzuki

(10) Patent No.: US 6,218,610 B1
(45) Date of Patent: Apr. 17, 2001

(54) STRUCTURE FOR SHIELDING AN ELECTRONIC CIRCUIT FROM RADIO WAVES

(75) Inventor: Masataka Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/103,501

(22) Filed: Jun. 24, 1998

(30) Foreign Application Priority Data

Jun. 25, 1997 (JP) .................................................. 9-169249

(51) Int. Cl.[7] .................................................. H05K 9/00
(52) U.S. Cl. .................... 174/35 R; 361/816; 361/818; 174/35 MS
(58) Field of Search .............................. 174/35 R, 35 MS, 174/261, 35 TS; 361/816, 818, 752, 753; 455/300

(56) References Cited

U.S. PATENT DOCUMENTS

| | | | |
|---|---|---|---|
| 4,474,676 | * 10/1984 | Ishino et al. | 252/62.54 |
| 5,150,282 | * 9/1992 | Tomura et al. | 361/424 |
| 5,191,174 | * 3/1993 | Chang et al. | 174/266 |
| 5,412,340 | 5/1995 | Tanikoshi | 330/68 |
| 5,418,685 | 5/1995 | Hussmann et al. | 361/719 |
| 5,438,482 | * 8/1995 | Nakamura et al. | 361/816 |
| 5,455,117 | * 10/1995 | Nagano et al. | 428/545 |
| 5,557,507 | * 9/1996 | Koike et al. | 361/816 |
| 5,566,055 | 10/1996 | Salvi, Jr. | 361/816 |
| 5,687,064 | * 11/1997 | Nichols | 361/752 |
| 5,780,776 | * 7/1998 | Noda | 174/255 |
| 5,986,218 | * 11/1999 | Muto et al. | 174/261 |

FOREIGN PATENT DOCUMENTS

| | | |
|---|---|---|
| 295 15 035 | 2/1996 | (DE) . |
| 2150749 | * 7/1985 | (GB) . |
| 64-40910 | 3/1989 | (JP) . |
| 1-89793 | 6/1989 | (JP) . |
| 2-133284 | 11/1990 | (JP) . |
| 4-205612 | 7/1992 | (JP) . |

* cited by examiner

Primary Examiner—Dean A. Reichard
Assistant Examiner—W. David Walkenhorst
(74) Attorney, Agent, or Firm—Young & Thompson

(57) ABSTRACT

A structure for shielding an electronic circuit from radio waves, including a shield case formed therein with a cavity which is open in one side of the shield case, a first electrically conductive layer formed on an inner surface of the cavity, and a printed wiring board. The printed wiring board includes a main board closing the cavity therewith as a cover, an electronic circuit mounted on a lower surface of the main body, and a second electrically conductive layer coextensive with the main body and making electrical contact with the first electrically conductive layer when the printed wiring board is put onto the open side of the shield case. The second electrically conductive layer cooperates with the first electrically conductive layer to form a shielded space in which an electronic circuit is to be mounted. In accordance with the above-mentioned shield structure, a shield for an electronic circuit is formed in only two parts: a shield case and a printed wiring board.

15 Claims, 5 Drawing Sheets

STRUCTURE FOR SHIELDING AN ELECTRONIC CIRCUIT FROM RADIO WAVES

BACKGROUND OF THE INVENTION

1. Field of the Invention

The invention relates to a structure for shielding an electronic circuit from radio waves, and more particularly to a structure for shielding a radiofrequency circuit equipped with an antenna.

2. Description of the Related Art

A conventional structure for shielding a radio-frequency circuit is comprised of a shield case composed of metal for encasing a radio-frequency circuit therein to shield the circuit from radio-waves. Accordingly, since an antenna has to be arranged outside the shield case, the radio-frequency circuit is electrically connected to the antenna through a connector and a cable.

In order to solve this problem, Japanese Unexamined Utility Model Publication No. 64-40910 published on Mar. 10, 1989 has suggested such a plastic shield case as illustrated in FIGS. 1A and 1B. FIG. 1A is a perspective view of the suggested plastic shield case, and FIG. 1B is a cross-sectional view taken along the line 1B—1B in FIG. 1A.

The plastic shield case is constituted of an upper half 2a and a lower half 2b. A radio-frequency circuit (not illustrated) is formed on an upper surface of a printed wiring board 1. The upper and lower halves 2a and 2b are assembled in such a manner that the printed wiring board 1 is sandwiched between the upper and lower halves 2a and 2b. Each of the upper and lower halves 2a and 2b are formed with two cavities, and inner surfaces of those two cavities are covered with an electrically conductive layer 3 composed of metal for radio-waves shielding. The electrically conductive layer 3 partially extends outside the upper half 2a to thereby form an antenna element 4.

In accordance with the suggested shield case, the radio-frequency circuit can be electrically connected to the antenna element 4 without a connector and a cable.

However, the above-mentioned plastic shield case has to have the two halves 2a and 2b for sandwiching the printed wiring board 1 therebetween. The reason is as follows. If the printed wiring board 1 is shielded only at an upper surface on which an electronic circuit is mounted, external radio-waves enter the electronic circuit and internal radio-waves leaks from the electronic circuit both through a lower surface of the printed wiring board. Thus, it is absolutely necessary to shield the printed wiring board at upper and lower surfaces thereof The use of the upper and lower halves 2a and 2b causes a problem that the shield structure is totally heavy, big in size, and high in fabrication cost.

In addition, in the above-mentioned plastic shield case, the antenna element 4 is formed on the upper half 2a separately from the printed wiring board 1 on which a radio-frequency circuit is formed. Hence, when the printed wiring board 1 is shielded with the upper and lower halves 2a and 2b, it is necessary to electrically connect the radio-frequency circuit to the antenna element 4.

As a result, assembly of the plastic shield case would take much time and much labor. In addition, when the plastic shield case is disassembled to take out the printed wiring board 1 for inspection and is assembled again, laborious work has to be done, specifically, the radio-frequency circuit is disconnected from the antenna element 4 and connected again to the antenna element 4, in which case, the radio-frequency circuit may be imperfectly, electrically connected to the antenna element 4.

SUMMARY OF THE INVENTION

In view of the foregoing problems, it is an object of the present invention to provide a structure for shielding an electronic circuit, which can be formed in a smaller size, a smaller weight, and a lower cost, and which can be readily assembled.

In one aspect of the present invention, there is provided a structure for shielding an electronic circuit from radio waves, including (a) a shield case open in one side and covered at an inner surface thereof with a first electrically conductive layer, and (b) a printed wiring board including a second electrically conductive layer which cooperates with the first electrically conductive layer to form a shielded space in which an electronic circuit is to be mounted, when the printed wiring board is put onto the open side of the shield case.

There is further provided a structure for shielding an electronic circuit from radio waves, including (a) a shield case formed therein with a cavity which is open in one side of the shield case, (b) a first electrically conductive layer formed on an inner surface of the cavity, and (c) a printed wiring board including (c-1) a main board closing the cavity therewith as a cover, (c-2) an electronic circuit mounted on a lower surface of the main body, and (c-3) a second electrically conductive layer coextensive with the main body and making electrical contact with the first electrically conductive layer when the printed wiring board is put onto the open side of the shield case, the second electrically conductive layer cooperating with the first electrically conductive layer to form a shielded space in which an electronic circuit is to be mounted.

In accordance with the above-mentioned shield structure, the shield case and the printed wiring board cooperate with each other to form a shielded space, in which an electronic circuit formed on a lower surface of the printed wiring board is put. In addition, since the first electrically conductive layer makes electrical contact with the second electrically conductive layer to thereby form an electrically shielded space, the electronic circuit is also put in the thus formed electrically shielded space. Thus, since the printed wiring board forms a part of the shield structure, only one shield case is necessary for forming the shield structure unlike the conventional shield structure wherein two halves are required for forming a shield case. Hence, the shield case in accordance with the present invention can be formed in a smaller weight, a smaller volume, and a lower cost.

It is preferable that the shield case is formed at the open side thereof with a stepped portion on which the main board of the printed wiring board is to be put.

For instance, the first electrically conductive layer may be composed of an electrically conductive coating film which is composed of, for instance, a coating including metal powders therein. For instance, the shield case is made of plastics.

For instance, the second electrically conductive layer may be composed of a metal foil, or a metal film evaporated onto the main board of the printed wiring board.

In a preferred embodiment, the shield structure further includes an antenna formed on an upper surface of the main board of the printed wiring board in such a manner that the antenna is in electrical connection with the electronic circuit.

In accordance with this embodiment, since an antenna and an electronic circuit are formed on opposite surfaces of the main body, and the antenna is electrically connected to the electronic circuit, it is no longer necessary to carry out a step of electrically connecting an antenna to an electronic circuit, which ensures that an imperfect contact between an antenna and an electronic circuit does not occur.

When the shield structure further includes an antenna, it is preferable that the main board is formed with at least one through-hole extending between upper and lower surfaces thereof, and the antenna and the electronic circuit make electrical connection with each other through a wire extending in the through-hole.

The printed wiring board may further include a plurality of printed boards, in which case the main board and the second electrically conductive film are sandwiched between two of the printed boards. When the printed wiring board includes two printed boards, the main board is sandwiched between them. When the printed wiring board further includes a plurality of printed boards, it is preferable that the printed wiring board includes (a) an upper electrode layer formed at a marginal region of an upper surface of an uppermost printed board, (b) a lower electrode layer formed at a marginal region of a lower surface of a lowermost printed board, and (c) a third electrically conductive layer causing the upper and lower electrode layers and the second electrically conductive layer to make electrical connection with one another. In this case, it is preferable that the lower electrode layer makes contact with the first electrically conductive layer, so that the first and second electrically conductive layers make electrical contact with each other through the third electrically conductive layer.

It is preferable that at least one through-hole is formed through the printed boards, the main board, and the second electrically conductive layer so that the through-hole reaches the upper and lower electrode layers, and further comprising a third electrically conductive layer formed on an inner surface of the through-hole.

It is preferable that the third electrically conductive layer is formed on a side surface of the printed wiring board between the upper and lower electrode layers.

In another aspect of the present invention, there is provided a shield case to be used in combination with a printed wiring board including a second electrically conductive layer coextensive with the printed wiring board, the shield case being formed therein with a cavity which is open in one side of the shield case, and including a first electrically conductive layer formed on an inner surface of the cavity and making electrical contact with the second electrically conductive layer when the printed wiring board is put onto the open side of the shield case, the first electrically conductive layer cooperating with the second electrically conductive layer to form a shielded space in which an electronic circuit is to be mounted.

It is preferable that the shield case is formed at an open side thereof with a stepped portion on which the main board of the printed wiring board is to be put.

In accordance with the above-mentioned shield structure, a shield for an electronic circuit is formed in only two parts: a shield case and a printed wiring board. Thus, it is possible to form a shield structure in a smaller size, a smaller weight, and a lower cost.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1A:
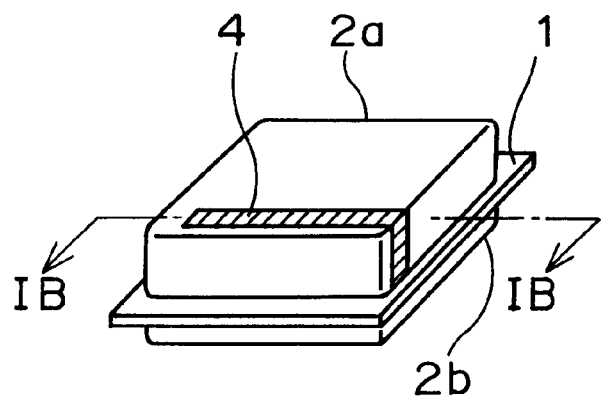
FIG. 1A is a perspective view of a conventional shield case.
Figure 1B:
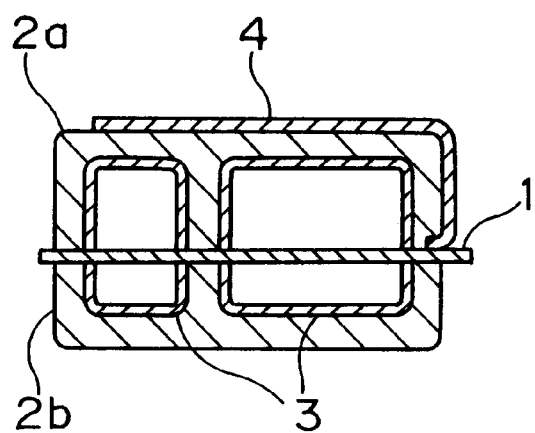
FIG. 1B is a cross-sectional view taken along the line 1B—11B in FIG. 1A.
Figure 2A:
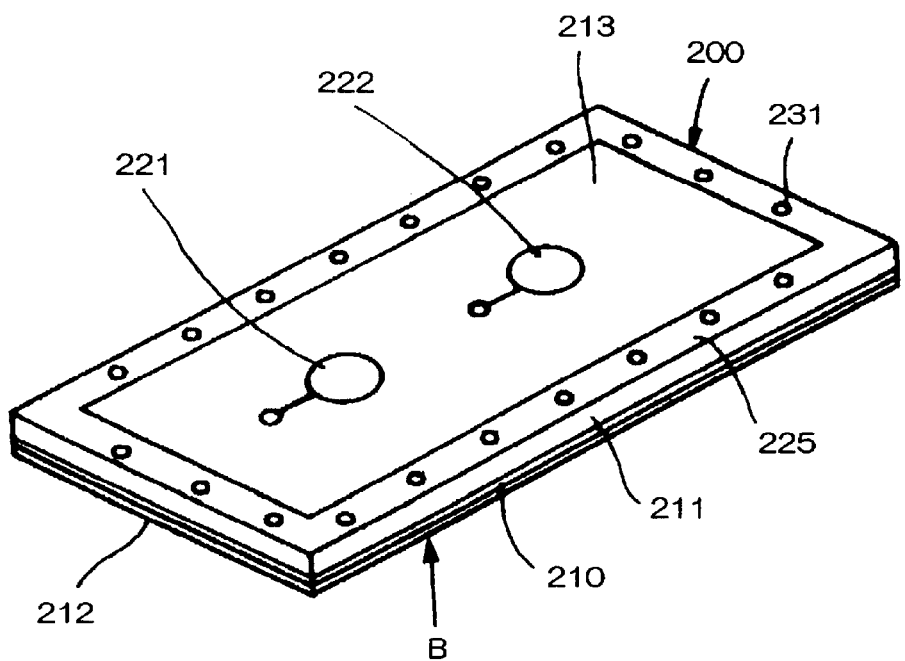
FIG. 2A is a perspective view of a printed wiring board constituting a part of a shield structure in accordance with the first embodiment of the present invention.
Figure 2B:
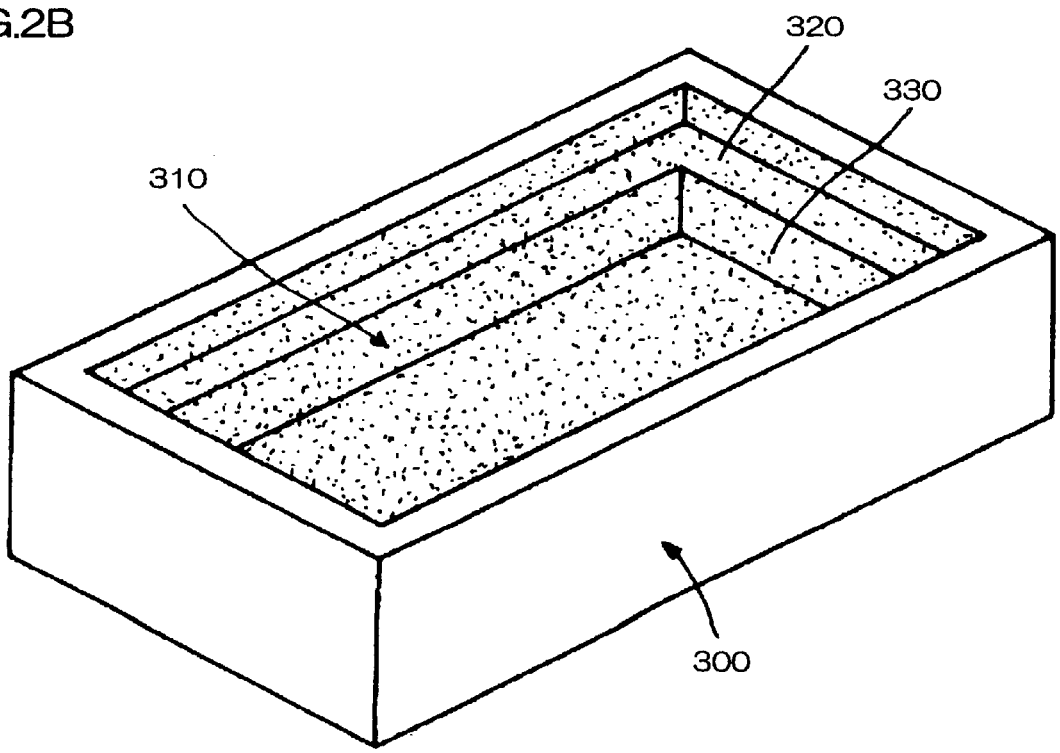
FIG. 2B is a perspective view of a shield case constituting a part of a shield structure in accordance with the first embodiment of the present invention.
Figure 5:
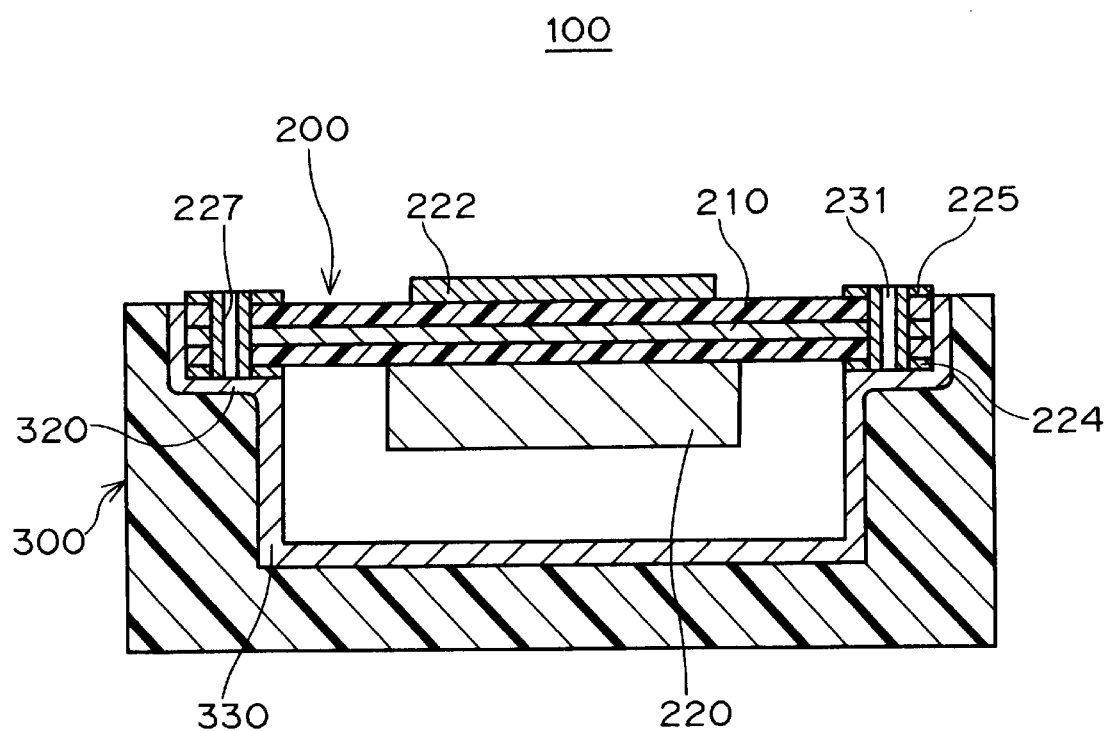
FIG. 5 is a cross-sectional view of a shield structure in accordance with a preferred embodiment of the present invention.

With reference to FIGS. 2A, 2B, and 5 a structure 100 for shielding an electronic circuit is comprised of a printed wiring board 200 illustrated in FIG. 2A and a shield case 300 illustrated in FIG. 2B.

As illustrated in FIG. 2B, the shield case 300 is open in an upper side thereof, and is made of plastic. The shield case 300 is formed having an open side 310 with a stepped portion 320, onto which the printed wiring board 200 is fit to thereby close the open side 310 of the shield case 300.

The shield case 300 is formed, at an entire inner surface thereof, with a first electrically conductive layer 330 acting as a shielding material. For instance, the first electrically conductive layer 330 may be composed of an electrically conductive coating film, which may be formed by spraying a paint containing metal powders therein onto an inner surface of the shield case 300.

Figure 3:
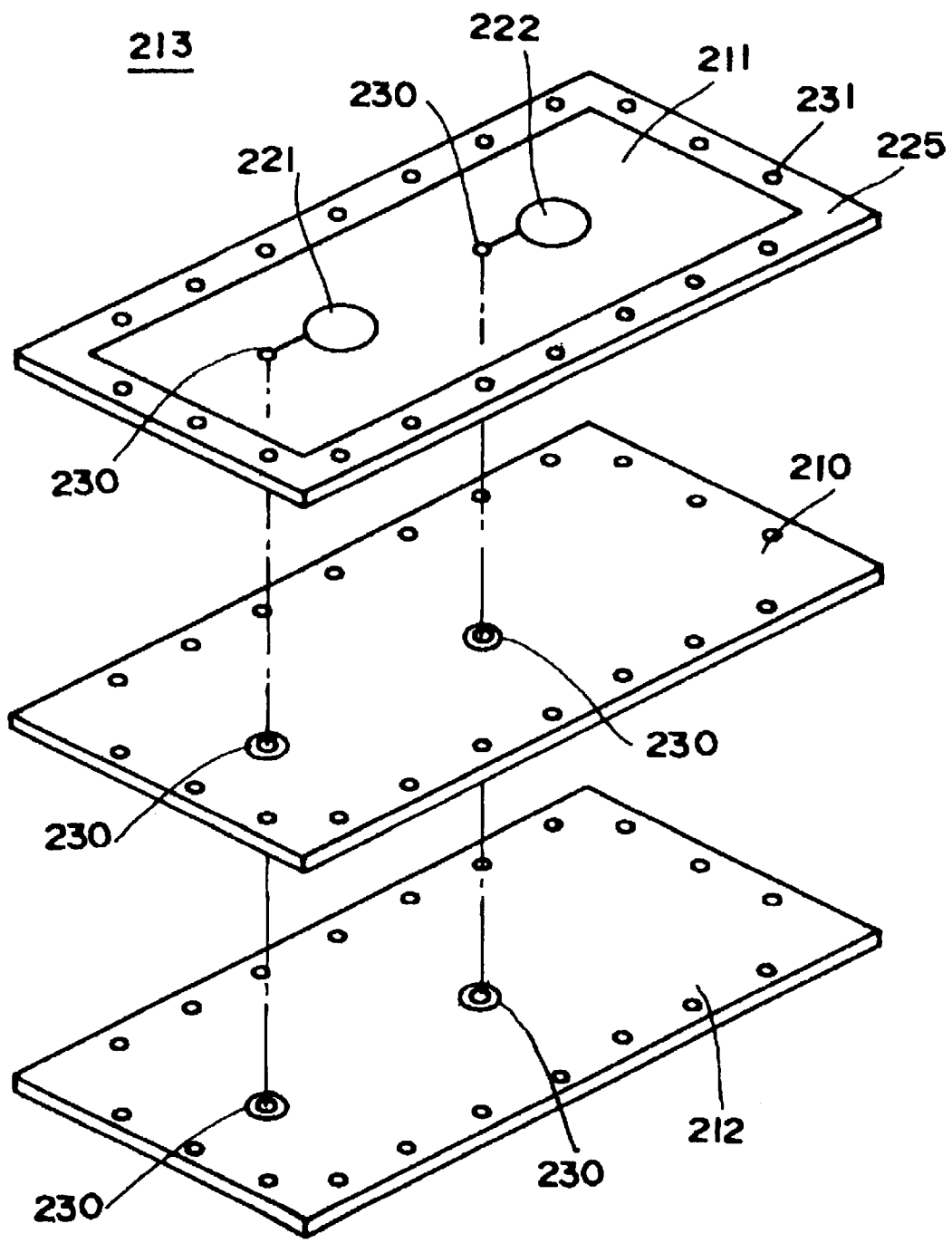
FIG. 3 is an exploded perspective view of the printed wiring board illustrated in FIG. 2A.

As illustrated in FIG. 3, the printed wiring board 200 includes a main board 213 having a three-layered structure. Specifically, the main board 213 is comprised of a second electrically conductive layer 210 composed of metal foil, a first printed board 211 formed on the second electrically conductive layer 210, and a second printed board 212 formed below the second electrically conductive layer 210. The main board 213 is fit into the stepped portion 320 of the open side 310 of the shield case 300.

Figure 4:
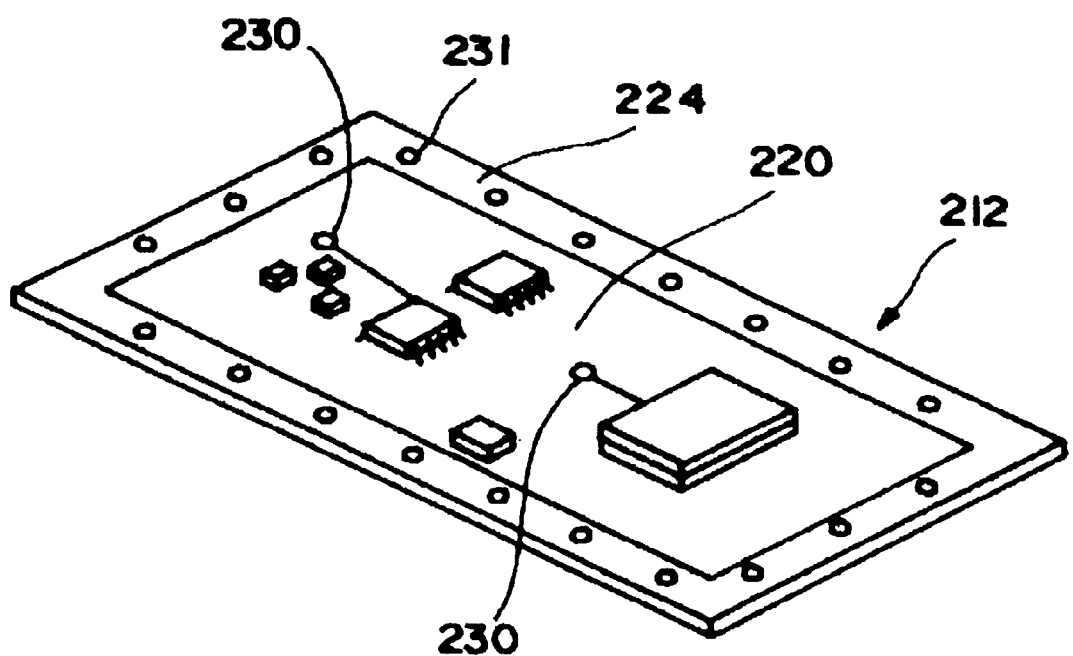
FIG. 4 is a perspective view of the printed wiring board at a lower surface thereof, as viewed from an arrow B shown in FIG. 2A.

A radio-frequency circuit block 220 is formed on a lower surface of the second printed board 212 of the main board 213, as illustrated in FIG. 4. As mentioned later, the second electrically conductive layer or metal foil 210 shields the radio-frequency circuit block 220 from radio-waves.

As illustrated in FIG. 3, the first printed board 211 is formed on an upper surface thereof with two antennas 221 and 222. The antennas 221 and 222 are formed, for instance, by steps of forming a metal film on an upper surface of the first printed board 211 by evaporation or plating, for instance, and etching the thus formed metal film into a desired pattern.

As illustrated in FIGS. 3 and 4, there are formed through-holes 230 in the vicinity of the antennas 221 and 222 throughout the first printed board 211, the metal foil 210, and the second printed board 212. The antennas 221 and 222 formed on an upper surface of the first printed board 211 and the radio-frequency circuit block 220 formed on a lower surface of the second printed board 212 are electrically connected with each other through electrically conductive wires (not illustrated) extending between the antennas 221, 222 and the radio-frequency circuit block 220 through the through-holes 230.

As illustrated in FIG. 4, a lower GND electrode layer 224 is formed in the form of a strip at a marginal region on a lower surface of the second printed board 212. Similarly, as illustrated in FIG. 3, an upper GND electrode layer 225 is formed in the form of a strip at a marginal region on an upper surface of the first printed board 211. These lower and upper GND electrode layers 224 and 225 may be formed by plating, for instance.

As best illustrated in FIG. 3, there are formed a plurality of throughholes 231 throughout the first printed board 211, the second electrically conductive layer 210, and the second printed board 212 SO that the through-holes 231 reach the lower and upper GND electrode layers 224 and 225.

As illustrated in FIG. 5, a third electrically conductive layer 227 is formed on an inner surface of each of the through-holes 231, for instance, by plating. The third electrically conductive layer 227 ensures that the upper and lower GND electrode layers 225, 224 and the second electrically conductive layer or metal foil 210 to make electrical connection with one another.

The shield structure 100 in accordance with the present embodiment is completed by closing the open side 310 of the shield case 300 with the printed wiring board 200. FIG. 5 is a cross-sectional view of the shield structure where the printed wiring board 200 is put onto the stepped portion 320 of the shield case 300. Hereinbelow functions of the shield structure 100 are explained in accordance with the present embodiment, with reference to FIG. 5.

The printed wiring board 200 is put onto the stepped portion 320 of the shield case 300 in such a manner that the radio-frequency circuit block 220 is enclosed in the shield case 300. Thus, the radio-frequency circuit block 220 is hermetically shielded in a closed cavity defined by the printed wiring board 200 and the shield case 300.

When the printed wiring board 200 is put onto the stepped portion 320 of the shield case 300, the first electrically conductive layer 330 formed on an inner surface of the shield case 300 makes electrical contact with the lower GND electrode layer 224 at the stepped portion 320. Hence, the second electrically conductive layer 210 makes electrical contact with the first electrically conductive layer 330 through both the third electrically conductive layer 227 and the lower GND electrode layer 224.

Accordingly, the radio-frequency circuit block 220 formed on a lower surface of the second printed board 212 is enclosed within a shielded space defined by the second electrically conductive layer 210, the third electrically conductive layer 227, the lower and upper GND electrode layers 224 and 225, and the first electrically conductive layer 330, all of which are electrically connected to the one another. As a result, the radio-frequency circuit block 220 is shielded from external radio-waves, and leaks no radio-waves to the outside.

Since the antennas 221 and 222 are formed on an upper surface of the first printed board 211, the antennas 221 and 222 become integral with the shield structure 100 by covering the shield case 300 with the printed wiring board 200. The antennas 221 and 222 are shielded from the radio-frequency circuit block 220 by means of the first electrically conductive layer 210 located therebetween.

As mentioned so far, the present embodiment provides the shield structure 100 defined by the plastic shield case 300 and the printed wiring board 200 for shielding the radio-frequency circuit block 220. The shield structure 100 has a height almost equal to a height of the shield case 300. Hence, since the shield structure 100 can be formed of a single shield case unlike the conventional shield case comprised of two shield cases with a printed wiring board sandwiched therebetween, the shield structure 100 can be formed in a smaller height, a smaller weight, and a smaller fabrication cost.

In addition, since the antennas 221 and 222 are formed integrally with the printed wiring board 200, it is no longer necessary to use a connector and a cable for connecting the radio-frequency circuit block 220 and the antennas 221 and 222. This also contributes to that the shield structure 100 is formed in a smaller size, a smaller weight, and a smaller cost. Since the antennas 221, 222 and the radio-frequency circuit block 220 are electrically connected to each other without using movable parts unlike the conventional shield structure, it is possible to avoid imperfect contact therebetween.

Figure 6:
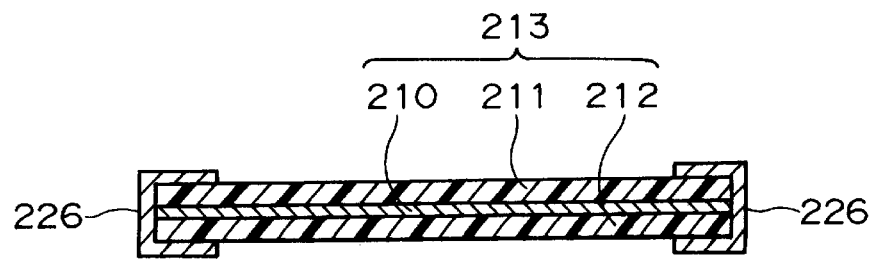
FIG. 6 is a cross-sectional view of a printed wiring board, illustrating another structure of the second electrically conductive film.

In the above-mentioned embodiment, the third electrically conductive layer 227 is formed on an inner surface of the through-holes 231. However, it should be noted that the third electrically conductive layer 227 might be designed to have other forms. For instance, as illustrated in FIG. 6, the third electrically conductive layer 227 may be formed as a layer 226 vertically extending on a side surface of the main board 213 so that the third electrically conductive layer 227 bridges between the lower and upper GND electrode layers 224 and 225.

As an alternative, the third electrically conductive layer 226 may be formed integrally with the lower and upper GND electrode layers 224 and 225, in which case, the third electrically conductive layer 226 is almost U-shaped.

In the above-mentioned embodiment, the second electrically conductive layer 210 is composed of metal foil. However, the second electrically conductive layer 210 may be composed of a thin metal film formed, for instance, by evaporation onto either an upper surface of the second printed wiring board 211 or a lower surface of the first printed wiring board 211. The first electrically conductive layer 330 may be formed by evaporation or plating in place of using an electrically conductive coating film.

Though the main board 213 is formed as having a three-layered structure in the above-mentioned embodiment, the main board 213 may be designed to have a four- or more layered structure.

It should be noted that a circuit to be shielded by the shield structure 100 in accordance with the above-mentioned embodiment is not to be limited to the radio-frequency circuit 220.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-169249 filed on Jun. 25, 1997 including specification, claims, drawings and summary is incorporated herein by reference in its entirety.

What is claimed is:

1. A structure for shielding an electronic circuit from radio waves, comprising:
   (a) a shield case open on one side and covered on an inner surface thereof with a first electrically conductive layer; and
   (b) a printed wiring board including an upper electrode layer formed at a marginal region of an upper surface, a lower electrode layer formed at a marginal region of a lower surface, a second electrically conductive layer which cooperates with said first electrically conductive layer to form a shielded space in which an electronic circuit is to be mounted, when said printed wiring board is put onto said open side of said shield case, and a third electrically conductive layer causing said upper and lower electrode layers and said second electrically conductive layer to make electrical connection with one another.

2. The structure as set forth in claim 1, wherein said shield case further comprises a stepped portion on which said printed wiring board is to be put as a cover.

3. The structure as set forth in claim 1, wherein said first electrically conductive layer is composed of an electrically conductive coating film.

4. The structure as set forth in claim 3, wherein said electrically conductive coating film is composed of a coating including metal powders therein.

5. The structure as set forth in claim 1, wherein said second electrically conductive layer is composed of a metal foil.

6. The structure as set forth in claim 1, wherein said second electrically conductive layer is composed of a metal film evaporated onto a main board of said printed wiring board.

7. The structure as set forth in claim 1, further comprising an antenna formed on an upper surface of said printed wiring board in such a manner that said antenna is in electrical connection with an electronic circuit formed on a lower surface of said printed wiring board.

8. The structure as set forth in claim 7, wherein said printed wiring board is formed with at least one through-hole extending between said upper and lower surfaces thereof, said antenna and said electronic circuit making electrical connection with each other through a wire extending in said through-hole.

9. The structure as set forth in claim 1, wherein said lower electrode layer makes contact with said second electrically conductive layer, so that said first and second electrically conductive layers make electrical contact with each other through said third electrically conductive layer.

10. The structure as set forth in claim 1, wherein at least one through-hole is formed through said printed wiring board and said second electrically conductive layer so that said through-hole reaches said marginal regions of said upper and lower electrode layers, wherein said third electrically conductive layer is on an inner surface of said through-hole.

11. The structure as set forth in claim 1, wherein said third electrically conductive layer is formed on a side surface of said printed wiring board between said upper and lower electrode layers.

12. A structure for shielding an electronic circuit from radio waves, comprising:
   (a) a shield case formed therein with a cavity which is open on one side of said shield case, said shield case having a conductive stepped portion in said cavity;
   (b) a first electrically conductive layer formed on an inner surface of said cavity; and
   (c) a printed wiring board including
      (c-1) a main board closing said cavity therewith as a cover;
      (c-2) an electronic circuit mounted on a lower surface of said main board; and
      (c-3) a second electrically conductive layer coextensive with said main board and making electrical contact with said first electrically conductive layer through said conductive stepped portion when said printed wiring board is put onto said conductive stepped portion of said shield case, said second electrically conductive layer cooperating with said first electrically conductive layer to form a shielded space in which an electronic circuit is to be mounted,
   wherein said printed wiring board further includes a plurality of printed boards, said main board and said second electrically conductive film being sandwiched between two of said printed boards,
   wherein said printed wiring boards includes:
      (a) an upper electrode layer formed at a marginal region of an upper surface of an uppermost printed board;
      (b) a lower electrode layer formed at a marginal region of a lower surface of a lowermost printed board; and
      (c) a third electrically conductive layer causing said upper and lower electrode layers and said second electrically conductive layer to make electrical connection with one another.

13. The structure as set forth in claim 12, wherein said lower electrode layer makes contact with said first electrically conductive layer, so that said first and second electrically conductive layers make electrical contact with each other through said third electrically conductive layer.

14. The structure as set forth in claim 12, wherein at least one through-hole is formed through said uppermost and said lowermost printed boards, said main board, and said second electrically conductive layer so that said through-hole reaches said upper and lower electrode layers, wherein said third electrically conductive layer is on an inner surface of said through-hole.

15. The structure as set forth in claim 12, wherein said third electrically conductive layer is formed on a side surface of said printed wiring board between said upper and lower electrode layers.

* * * * *